United States Patent [19]

Tang et al.

[11] Patent Number: 5,608,672
[45] Date of Patent: Mar. 4, 1997

[54] CORRECTION METHOD LEADING TO A UNIFORM THRESHOLD VOLTAGE DISTRIBUTION FOR A FLASH EPROM

[75] Inventors: Yuan Tang; Jian Chen, both of San Jose; Chung K. Chang, Sunnyvale, all of Calif.

[73] Assignee: Advanced Micro Devices, Inc., Sunnyvale, Calif.

[21] Appl. No.: 534,141

[22] Filed: Sep. 26, 1995

[51] Int. Cl.⁶ .................................................. G11C 13/00
[52] U.S. Cl. .................. 365/185.3; 365/185.29; 365/185.33; 365/218
[58] Field of Search .......................... 365/185.29, 185.3, 365/185.33, 218

[56] References Cited

U.S. PATENT DOCUMENTS 5,357,463  10/1994  Kinney ........................ 365/185.3 X
5,406,521   4/1995  Hara ......................... 365/185.29 X
5,416,738   5/1995  Shrivastava .................. 365/185.3 X
5,424,993   6/1995  Lee et al. .................... 365/185.3 X

*Primary Examiner*—Do Hyun Yoo
*Attorney, Agent, or Firm*—Benman Collins & Sawyer

[57] ABSTRACT

A method for correcting over-corrected memory cells in a flash EPROM. The flash EPROM includes an array of memory cells (25), where each of the cells includes a gate 18, a floating gate (16), a source (12), a drain (14), and a substrate (10). The method includes bulk erasing each of cells in the array of cells (step 40), which results in a plurality of over-erased cells. The over-erased cells are then corrected (step 42), which results in a plurality of over-corrected cells. The over-corrected cells are identified (step 44) and selectively erased (step 46), such that a uniform threshold voltage distribution (54) is provided for the cells in the flash EPROM.

1 Claim, 6 Drawing Sheets

CORRECTION METHOD LEADING TO A UNIFORM THRESHOLD VOLTAGE DISTRIBUTION FOR A FLASH EPROM

FIELD OF THE INVENTION

The present invention is directed to flash EPROMs, and more particularly to a correction method that provides a uniform threshold voltage distribution for a flash EPROM during programming.

BACKGROUND OF THE INVENTION

Nonvolatile programmable memories operate similar to read only memories with the attribute that they may be programmed at least once. An erasable programmable read-only memory (EPROM) is one type of nonvolatile programmable memory. Typically, the contents of an EPROM are programmed during manufacture, but the user is free to reprogram the contents at a later time.

An EPROM memory cell comprises a single transistor, that when read, is either on "1", or off "0". A transistor is read by applying a small positive electrical charge to the transistor that equals or surpasses the voltage required to read the cell, which is called the threshold voltage $V_t$. If the transistor is on, then the charge will cause electrons to flow through the transistor, which generates a current representing a 1 bit. If the transistor is off, then no current is generated by the transistor in response to the positive electrical charge, which represents a 0 bit.

Each EPROM transistor includes a structure called a floating-gate. The charge of the floating gate is dependent upon the number of electrons contained in the floating gate. During the programming of an EPROM, the charge of the floating gate for each cell can be altered to control whether each transistor is on or off.

During a procedure called erasing, electrons are pulled out of the floating gate of each cell in the flash EPROM array to neutralize the charge of the floating gate. When a cell is subsequently read, the positive electrical charge applied to the cell is unaffected by the neutrally charged floating gate and current is generated by the cell. Therefore, in the erase state, a cell is "1" or on.

Flash EPROMs suffers a disadvantage compared to EPROMs. EPROMs have the same physical structure as flash EPROM, but are erased differently. An EPROM is erased by exposure to ultraviolet light, which pulls the electrons out of the floating gate. This neutralizes every floating gate in the EPROM so that they have a zero charge.

A flash EPROM, in contrast, is erased by applying an electrical bias to the cells. The bias, however, can deplete the floating gate of electrons, which causes the charge on the floating gate to change from negative to positive, rather than staying neutral. This is referred to as an over-erased cell. When a cell has been electrically erased to depletion mode, its threshold voltage is lowered to the point where the transistor is on even when a zero volts bias is applied to the transistor. In some cases the threshold voltage may even become negative.

Conventional methods to correct the over erased cell are either inadequate in several respects or introduce further problems. One such problem is the over-correction of erased cells in which normally erased cells are changed from "1" (erased) to "0" or on. Over-correction also increases the threshold voltage of cells, which widens the threshold voltage distribution of the flash EPROM and makes the flash EPROM more difficult to read and program.

Accordingly, what is needed is a correction method that provides a flash EPROM that has a uniform threshold voltage distribution during programming.

SUMMARY OF THE INVENTION

The present invention provides a method for correcting over-corrected memory cells in a flash EPROM. The method comprises erasing each of cells in the array of cells, which results in a plurality of over-erased cells. After erasing the cells, the over-erased cells are then corrected, which results in a plurality of over-corrected cells. The over-corrected cells are then identified and selectively erased, such that a uniform threshold voltage distribution is provided for the flash EPROM.

According to the system and method disclosed herein, the present invention is capable of achieving a $V_t$ distribution width for a flash EPROM that is less than 1 v.

DESCRIPTION OF THE INVENTION

The present invention relates to an improvement in array $V_t$ distribution before programming flash EPROMs. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
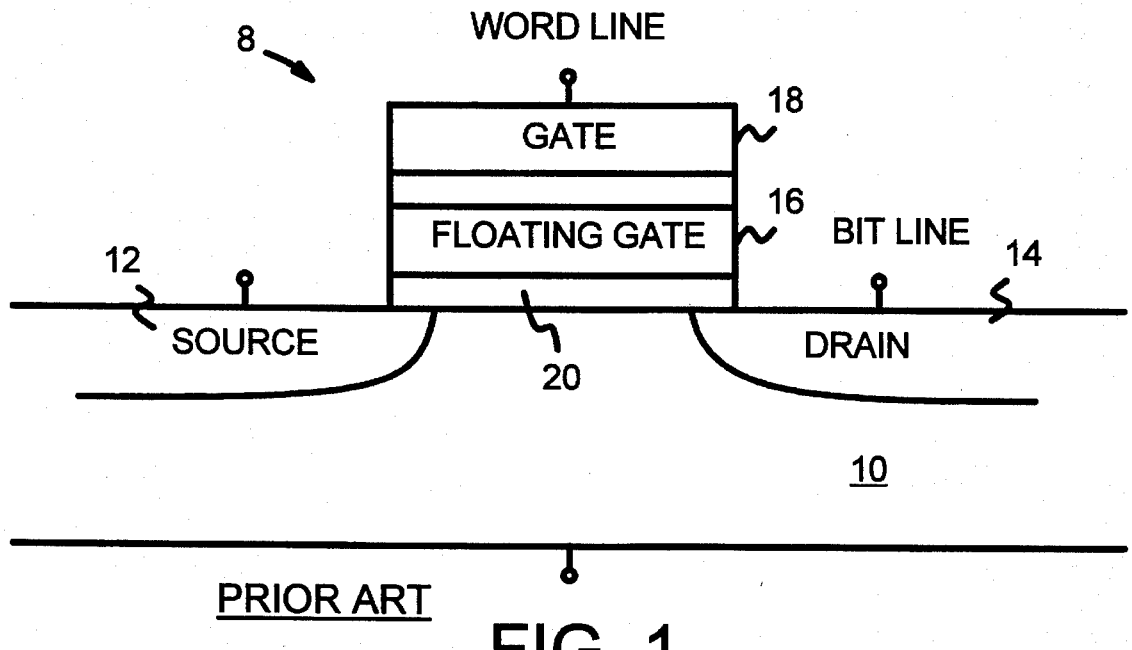
FIG. 1 is a block diagram showing a partial cross-sectional view of a flash EPROM cell.

FIG. 1 is a block diagram showing a partial cross-sectional view of a flash EPROM cell 8. The cell 8 includes a substrate 10, a source region 12, a drain region 14, a floating gate 16, and a control gate 18. As shown, the substrate 10, the source 12, the drain 14, and the control gate 18 each include a terminal for outside connections. A tunnel oxide region 20, having a thickness of between about 80–100 angstroms, lies between the substrate 10 and floating gate 16. Typically, the substrate 10 is doped with a p-type dopant, such as boron, while the source region 12 is preferably doped with an n-type dopant, such as phosphorous or arsenic. Drain region 14 is preferably doped with a high n+-doping, as is well known to those skilled in the art.

Figure 2:
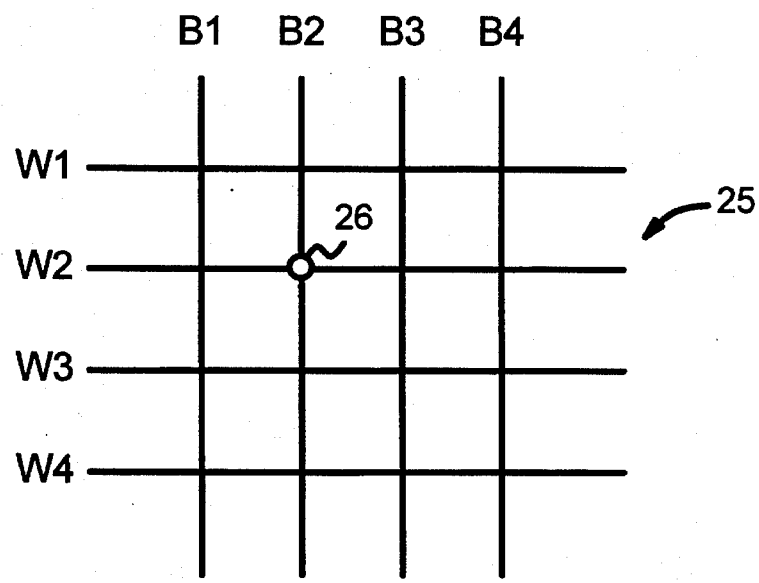
FIG. 2 is a block diagram showing a partial array of cells comprising a conventional flash EPROM.

FIG. 2 is a block diagram showing a partial array of cells 25 comprising a conventional EPROM. The cells in the array are connected by intersecting rows of word lines, W1, W2, W3, and W4, and columns of bit lines B1, B2, B3, and B4. The word lines are connected to the control gate 18 of each cell 26, while the bit line is connected to the drain 14. Each cell 26 in the array may be individually read by activating the word and bit lines connected to that cell. For example, cell 26 is read by activating word line W2 and bit line B2.

Figure 3:
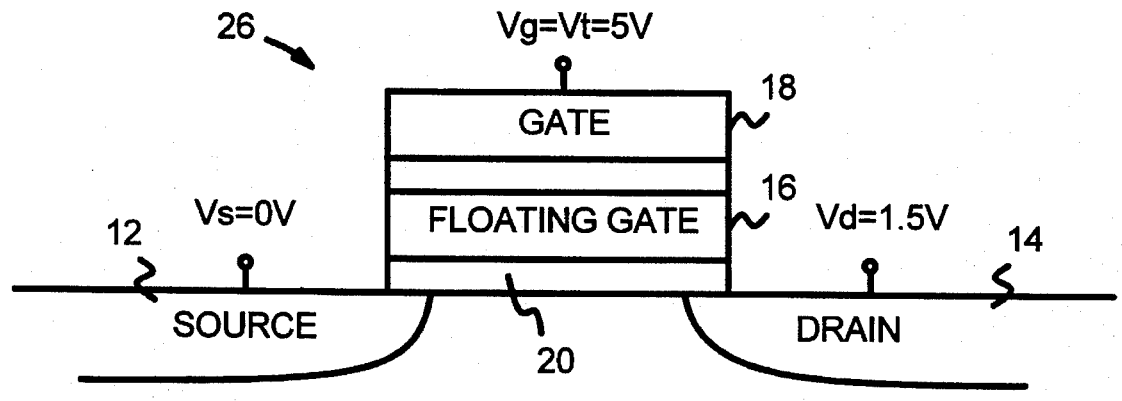
FIG. 3 is a block diagram of the bias conditions applied to a cell during a read operation.

FIG. 3 is a block diagram of the bias conditions applied to a cell 26 during a read operation, in which cell parts having like characteristics to the cell of FIG. 1 have the same reference numerals. Referring to FIGS. 2 and 3, the cell 26 is read by biasing the control gate 18 from word line W2 with a voltage potential $V_g$, which equals or surpasses the threshold voltage $V_t$ of the cell 26. The read result depends on the $V_t$ of the cell 26. At the same time, the drain 14 is biased with a voltage potential $V_d$ of approximately 1.5 v from the bit line B2. The source 12 and the substrate are biased at a ground potential of about 0 V.

During a bulk erase process, every cell in the array is erased to "1". After the bulk erase process, each cell in the array can either be programmed "0" using an electron injection process or left as "1", creating a pattern in the array.

Figure 4:
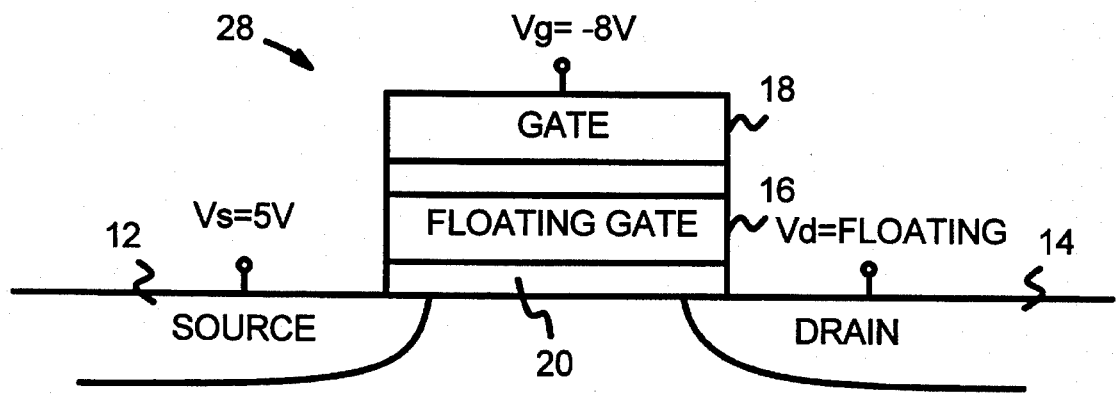
FIG. 4 is block diagram of the bias conditions applied to each cell during a bulk erase of entire array.

FIG. 4 is block diagram of the bias conditions applied to each cell 28 during a bulk erase of entire array. The purpose of the erase procedure is to ensure that every cell in the array is set to "1" by pulling electrons out of the floating gate 16 through the tunnel oxide region 20. As shown, cell 28 is erased by biasing the control gate 18 with a voltage potential $V_g$ of −8 v, and by biasing the source 12 with a voltage potential $V_s$ of 5 v. The drain 14 is left unconnected providing a floating voltage potential $V_d$, and the substrate 10 is grounded. Individual cells cannot be selectively erased during a bulk erase because the source 12 of every cell in the array is connected together.

During a bulk erase of a flash EPROM, the same bias is provided to every cell in the array until an erase verify step confirms that every cell is in the erase stage, meaning the threshold voltage of the cell is very low, such as 1 v. Once the array passes the erase verify step, electron injection is performed.

Figure 5:
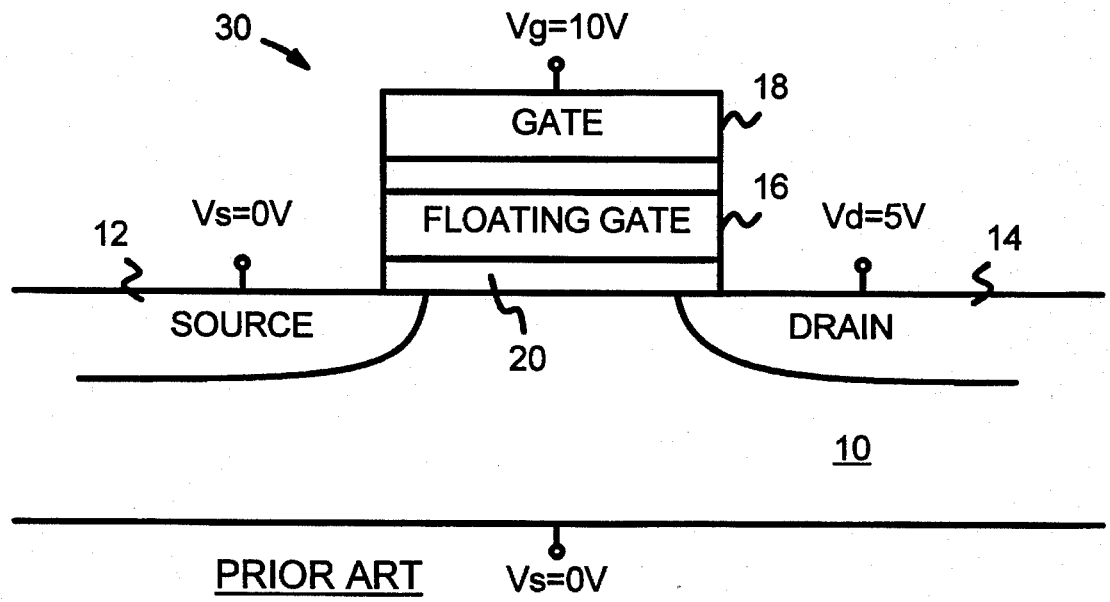
FIG. 5 is block diagram of the bias conditions selectively applied to a cell during electron injection.

FIG. 5 is block diagram of the bias conditions selectively applied to a cell 30 during electron injection. The purpose of the electron injection procedure is to ensure that selected cells in the array are set to "0" by injecting electrons into the floating gate 16 through the tunnel oxide region 20. As shown, electrons are injected into the floating gate 16 by biasing the control gate 18 with a voltage potential $V_g$ of 10 v, biasing the drain 14 with a voltage potential $V_d$ of 5 v, and by grounding the source 12 and the substrate 10. This procedure is cell selectable since both the word lines and the bit lines are used to bias the cell 30. After the cell 30 has been erased, the cell is on under a read condition because the $V_t$ of the cell is low. After a floating gate 16 has been injected full of electrons, the cell is off under a read condition because the $V_t$ of the cell is increased.

As stated above, before electron injection is performed, the array is first erased. Typically, the bulk erase of a flash EPROM results in over-erased cells that are depleted of electrons and consequently have negative threshold voltages.

Figure 6:
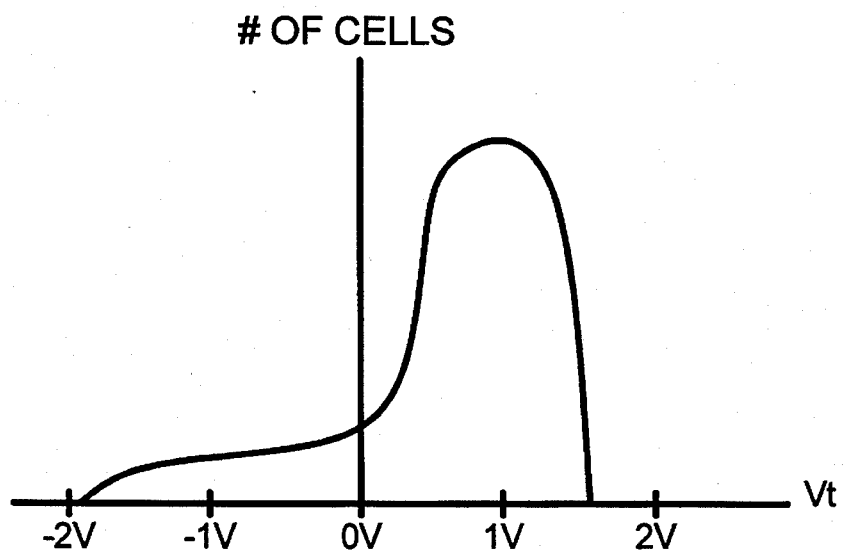
FIG. 6 is a graph showing a threshold voltage distribution for a flash EPROM having over-erased cells.

FIG. 6 is a graph showing a threshold voltage distribution for a flash EPROM having over-erased cells, where the horizontal axis is the threshold voltage (in volts), the vertical axis represents the number of cells, and the curve shows the number of cells in the array having a particular threshold voltage $V_t$. As shown, most of the erased cells have a positive $V_t$. However, some of the cells in the array have been over-erased and therefore have a negative threshold voltage.

The presence of over-erased cells in the array results in a flash EPROM that is unreliable and difficult to program. As described above, to read a particular cell, a bias is supplied on the corresponding word and bit lines. All the other word and bit lines in the array are set to 0 v. Assuming the cell to be read is on the same bit line as an over-erased cell, when the read operation begins, the over-erased cell will detect the 0 v from its word line and 1.5 v from the bit line. Since the over-erased cell has a negative threshold voltage, the 0 v on the word line surpasses the cell's threshold voltage, which causes current to flow from the over-erased cell to the bit line. Therefore, no matter how many electrons are injected into the floating gate of the first cell to turn the cell off, the first cell will always appear as being on or "1" when read.

Therefore, after performing a bulk erase, a $V_t$ distribution is required that is all positive in which no over-erased cells exist in the array. This is accomplished by correcting any over-erased cells in the flash EPROM.

Figure 7:
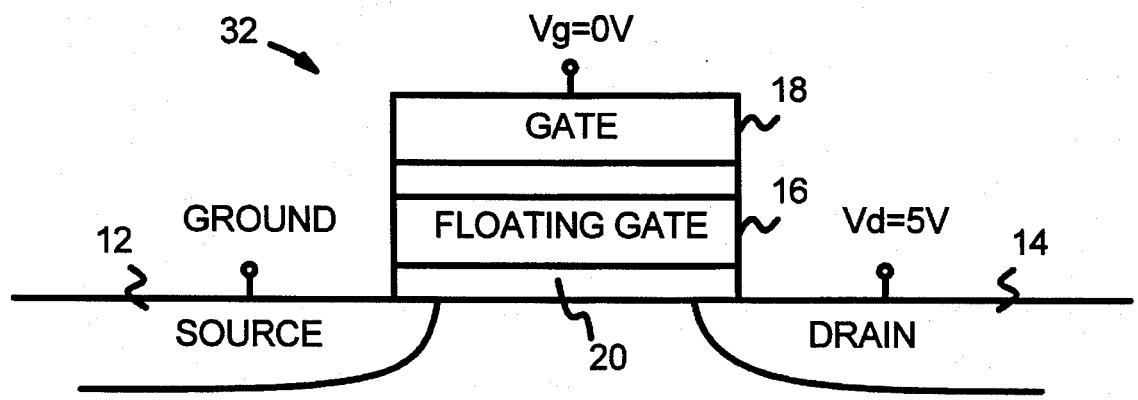
FIG. 7 is block diagram of the bias conditions applied to a over-erased cell by a conventional correction method.

One conventional method for correcting over erased cells, called automatic programming distribution (APD), lowers the $V_g$ on the control gate 18 in order to re-inject electrons into a depleted floating gate 16. FIG. 7 is block diagram of the bias conditions applied to a over-erased cell 32 by the APD correction method. A positively-charged depleted floating gate 16 in a over-erased cell 32 is re-injected with electrons by biasing the control gate 18 with a voltage potential $V_g$ of 0 v, biasing the drain 14 with a voltage potential $V_d$ of 5 v, and by grounding the source 12 and the substrate 10. Even when $V_g$ is lowered to 0 v, a positive voltage is still present on the floating gate 16, which can cause injection of a small portion of electrons back into a depleted floating gate 16. This method is bit line selectable since activating a given bit line will correct all over-erased cells 32 along that bit line.

Although the APD method successfully corrects over-erased cells and does not affect normally erased cells, the APD method has several drawbacks. First, if the EPROM includes too many over-erased cells, the APD method fails to correct over erasure because the load on the power supply causes the voltage on the drain to drop below the level required to inject electrons into the floating gate 16.

Another drawback to the APD correction method is that it is temperature dependent. Higher temperatures lowers the $V_t$ of the array. If, for example, the $V_t$ is 0 v, higher temperatures (95 degrees) may lower the $V_t$ to −0.5 v. Therefore, when the temperature of the array is too high, every cell may leak current. Also, the electron injection becomes inefficient at high temperatures, which makes the correction of over-erased cells even more difficult.

Figure 8:
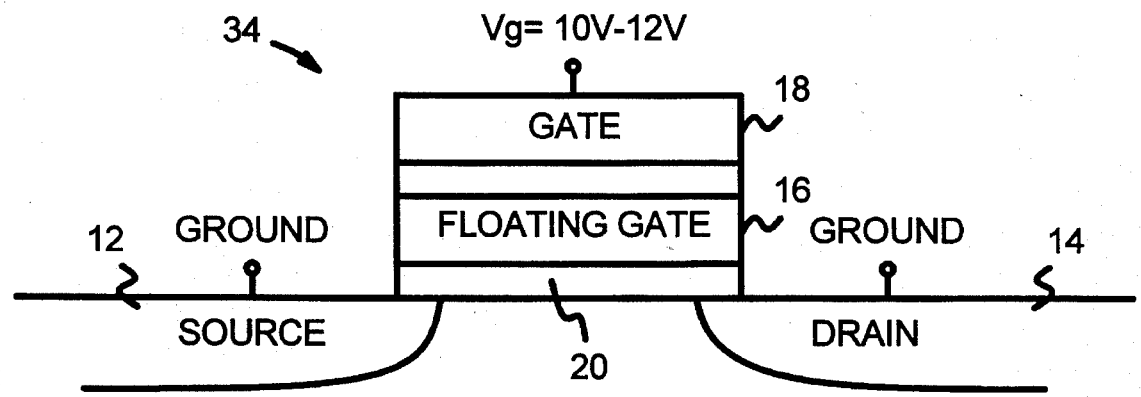
FIG. 8 is block diagram of the bias conditions applied to an over-erased by a second correction method.

Another method for correcting over-erased cells is not bit line selectable, but rather corrects the entire array at once. FIG. 8 is block diagram of the bias conditions applied to an over-erased cell 34 by a second correction method. A positively-charged depleted floating gate 16 in a over-erased cell 34 is re-injected with electrons by biasing the control gate 18 with a high voltage potential $V_g$, such as 10–12 v, and by grounding the drain 14, the the source 12, and the substrate 10. This non-selectable correction method has advantages over the APD method in that the non-selectable method is not limited to the number of over-erased cells in the array and is also temperature independent.

The non-selectable correction method, however, also has disadvantages. Recall that during programming of a flash EPROM, the purpose of an erase is to make all the cells in the array "1" in which the floating gate 16 has a neutral charge. But after erase, some of the floating gates 16 are depleted and become positively charged. The purpose of correction is to re-inject electrons into depleted floating gate 16 to neutralize their charge. The principal disadvantage of the non-selectable correction method is it may over-correct some of the normally erased cells by injecting too many electrons into the floating gates 16. This changes the cells from "1" (erased state) to "0" and causes these cells to fail the erase verify step during programming. This means that all of the erase steps must be repeated; bulk erase, erase verify, and correction of over-corrected cells. If any of the cells fail the erase verify, the steps are again repeated.

When the non-selectable correction method changes normally erased cells from "1" to "0", the $V_t$ of the normally erased cells is also increased. Thus, the non-selectable correction method may provide a $V_t$ distribution that includes cells having a negative $V_t$ as well as cells having a higher than normal $V_t$. Since the non-selectable correction method may lead a flash EPROM to an erase verify failure, the method is seldom implemented during the programming of flash EPROMs.

Figure 9:
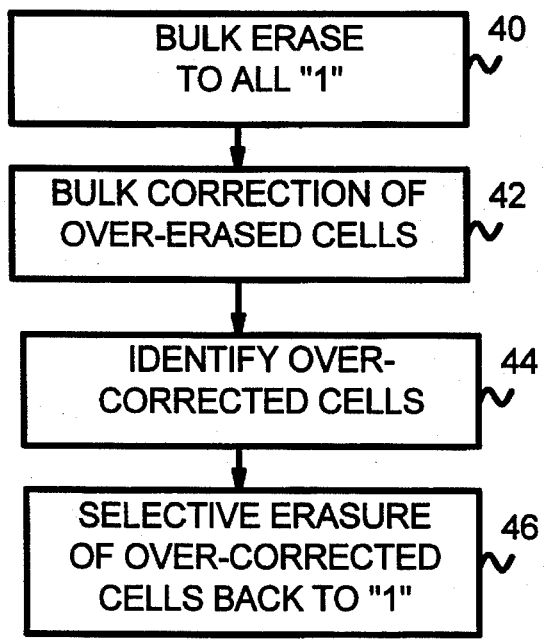
FIG. 9 is a flow chart depicting the steps performed during the correction method of the present invention, which results in a flash EPROM array having a uniform $V_t$ distribution before programming.

The present invention is a method and system for achieving a uniform $V_t$ distribution when using the non-selectable correction method during EPROM programming. According to the present invention, the non-selective correction method is improved by identifying any over-corrected cells in the array and by correcting the over-corrected cells back into the erase verify state. This is accomplished using a selective erase procedure of the present invention. To more particularly illustrate the correction method of the present invention, refer now to FIG. 9 depicting a flow chart of one embodiment of such a method, which results in a programmed EPROM having a uniform $V_t$ distribution.

The array is first bulk erased in step 40 to make all the cells "1", as described above. At this point, some of the cells may have been over-erased. After the bulk erase, non-selective correction of the over-erased bits is performed in step 42. This step results in over-corrected cells that have been changed from "1" to "0". Usually there is only a small number of over-corrected cells, such as ten over-corrected bits for example, versus one-million. After non-selective correction, the array is read to identify which cells have been over-corrected in step 44. Next, a selective erase procedure of the present invention is performed to correct the over-corrected cells from "0" back to "1". Accordingly, the correction method of the present invention results in a more uniform $V_t$ distribution than prior methods.

Figure 10:
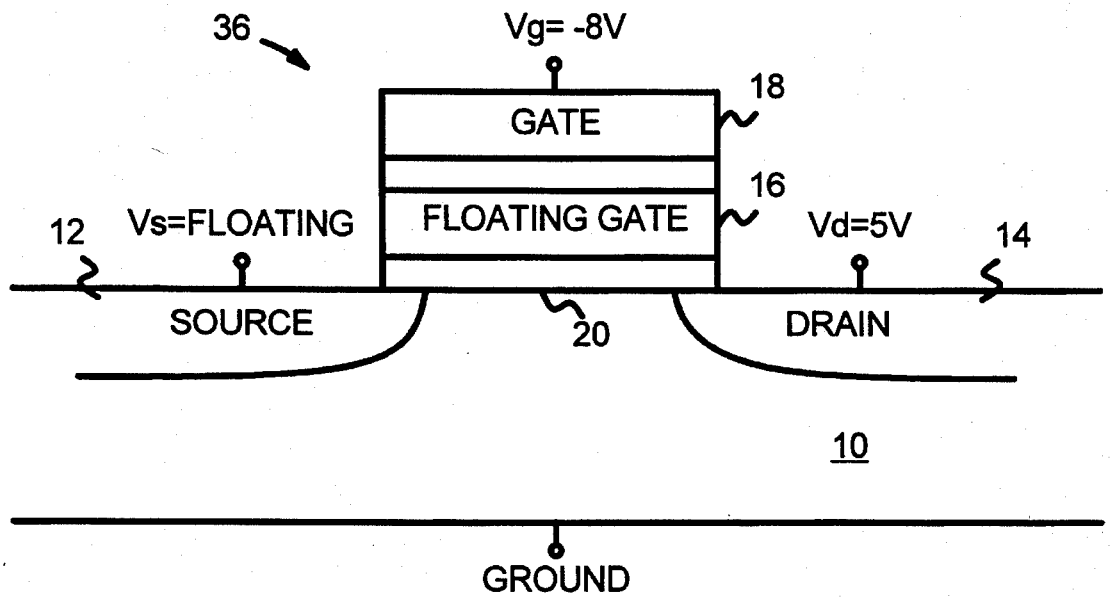
FIG. 10 is a block diagram of the bias conditions applied to an over-corrected cell during the selective erase procedure of the present invention.

FIG. 10 is a block diagram of the bias conditions applied to an over-corrected cell 36 during the selective erase procedure of the present invention in which electrons are pulled out of the floating gate 16. As shown, an over-corrected cell 36 is corrected by biasing the control gate 18 with a negative voltage potential $V_g$, the drain 14 is biased with a positive voltage potential $V_d$, the source 12 is left unconnected providing a floating voltage potential $V_s$, and the substrate 10 is grounded. The positive voltage potential $V_d$ on the drain 14 should be less than the gate diode breakdown voltage in the drain junction to avoid degradation. In a preferred embodiment of the present invention, $V_g$ is −8 v and $V_d$ is 5 v.

The erase procedure of the present invention is selectable, as opposed to conventional erase methods, due to the fact that the source 12 is floated while a positive voltage is applied to the drain 14 via the bit line, which is selectable. According to the present invention, the selective erase procedure enables the correction of the over-corrected cells created by the non-selective correction method.

Figure 11:
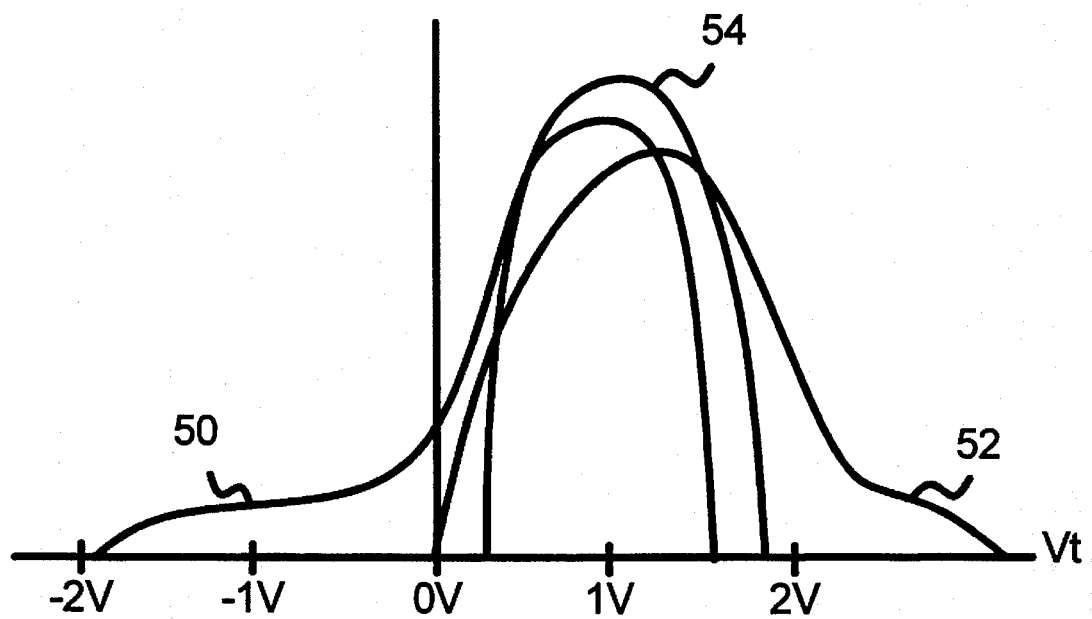
FIG. 11 is a graph showing how the $V_t$ distribution curve changes during bulk erase and correction when the correction method of the present invention is employed.

FIG. 11 is a graph showing how the threshold voltage distribution curve changes during EPROM erasure and correction when the correction method of the present invention is employed. The curve 50 is identical to the curve in FIG. 6 and illustrates the distribution after the bulk erase state in which over-erased cells exist. Curve 52 is the distribution after non-selective correction is performed. Although over-erased cells have been eliminated, the method results in over-corrected cells having a higher $V_t$. Curve 54 illustrates the uniform distribution after the selective erase method of the present invention in which the $V_t$ of the over-corrected cells are returned to normal, resulting in a uniform $V_t$.

The correction method of the present invention provides several advantages over the APD correction method. First, the correction method is capable of correcting massive over-erasure of a flash EPROM, whereas the APD method is only effective when the number of over-erasures is limited. The correction method of the present invention is still effective in shifting $V_t$ when $V_t > 0$ v. In comparison, the APD method is limited by conversion $V_t < 0$ v. In addition, the correction method requires low energy during the correction of over-corrected cells by using channel tunneling instead of hot-carrier injection. Also, the correction time is on the same order as bulk erasure, and the method is not difficult to implement circuit wise.

A method and system has been disclosed for correcting over-corrected cells in a flash EPROM that is capable of achieving a $V_t$ distribution that has a width of less than 1 v. The voltages specified herein are suitable for 0.5 to 0.8 um flash technology. As cell sizes decrease, the voltages used herein should be reduced accordingly.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

We claim:

1. A method for correcting over-corrected cells in a flash EPROM comprising an array of cells, each cell having a gate, floating gate, source, drain, and substrate, the method comprising:

(a) erasing each of the cells in the array of cells by (a1) providing a negative voltage to the gate of each of the cells in the array of cells, (a2) providing a positive voltage to the source of each of the cells in the array of cells, (a3) providing a floating voltage to the drain of each of the cells in the array of cells, and (a4) grounding the substrate of each of the cells in the array of cells, wherein the eras/rig of the cells results in a plurality of over-erased cells;

(b) bulk correcting the plurality of over-erased cells by (b1) providing a positive voltage to the gate of each of the cells in the array of cells, (b2) grounding the source of each of the cells in the array of cells, (b3) grounding the drain of each of the cells in the array of cells, and (b4) grounding the substrate of each of the cells in the array of cells, wherein the correction of the plurality of over-erased cells results in a plurality of over-corrected cells;

(c) identifying the over-corrected cells by reading each one of the cells and identifying particular ones of the cells that have changed from "1" to "0"; and (d) selectively erasing the over-corrected cells by (d1) providing a negative voltage to the gate of each of the over-corrected cells in the array of cells, (d2) providing a floating voltage to the source of each of the over-corrected cells in the array of cells, (d3) providing a positive voltage to the drain of each of the over-corrected cells in the array of cells, and (d4) grounding the substrate of each of the over-connected cells in the array of cells, wherein the selective erasing of the over-corrected cells provides a uniform threshold voltage distribution for the cells in the flash EPROM.

* * * * *